(12) United States Patent
Butler et al.

(10) Patent No.: US 10,866,529 B2
(45) Date of Patent: Dec. 15, 2020

(54) LITHOGRAPHIC APPARATUS AND DEVICE MANUFACTURING METHOD

(71) Applicant: ASML NETHERLANDS B.V., Veldhoven (NL)

(72) Inventors: Hans Butler, Best (NL); Michael Johannes Vervoordeldonk, Rosmalen (NL); Maurice Willem Jozef Etiënne Wijckmans, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/483,660

(22) PCT Filed: Jan. 11, 2018

(86) PCT No.: PCT/EP2018/050640
§ 371 (c)(1),
(2) Date: Aug. 5, 2019

(87) PCT Pub. No.: WO2018/145849
PCT Pub. Date: Aug. 16, 2018

(65) Prior Publication Data
US 2019/0354021 A1 Nov. 21, 2019

(30) Foreign Application Priority Data
Feb. 10, 2017 (EP) .................................. 17155563

(51) Int. Cl.
*G03F 7/20* (2006.01)
(52) U.S. Cl.
CPC ............ *G03F 7/709* (2013.01); *G03F 7/7085* (2013.01); *G03F 7/70516* (2013.01)
(58) Field of Classification Search
CPC .. G03F 7/70825; G03F 7/709; G03F 7/70516; G03F 7/7085
(Continued)

(56) References Cited

U.S. PATENT DOCUMENTS

| 7,726,452 B2 | 6/2010 | Kraner |
| 9,976,931 B2 * | 5/2018 | Kwan ................. G03F 7/70825 |

(Continued)

FOREIGN PATENT DOCUMENTS

| JP | 2009-507359 A | 2/2009 |
| JP | 2014-526792 A | 10/2014 |

(Continued)

OTHER PUBLICATIONS

International Search Report and Written Opinion of the International Searching Authority directed to related International Patent Application No. PCT/EP2018/050640, dated Jul. 2, 2018; 16 pages.

(Continued)

*Primary Examiner* — Hung Nguyen
(74) *Attorney, Agent, or Firm* — Sterne, Kessler, Goldstein & Fox P.L.L.C.

(57) ABSTRACT

A lithographic apparatus is described, the apparatus comprising:
  a projection system configured to project a patterned beam of radiation onto a substrate; the projection system comprising a plurality of optical elements;
  a sensor frame;
  a first position measurement system configured to measure a position of the plurality of optical elements relative to the sensor frame; wherein the sensor frame comprises:
  N sub-frames, N being an integer >1,
  a coupling system coupling the N sub-frames and
  a second position measurement system configured to determine a relative position of the N sub-frames.

16 Claims, 7 Drawing Sheets

(58) Field of Classification Search
 USPC .................................................. 355/53, 67
 See application file for complete search history.

(56) References Cited

U.S. PATENT DOCUMENTS

| | | |
|---|---|---|
| 2003/0197914 A1 | 10/2003 | Cox et al. |
| 2005/0083500 A1* | 4/2005 | Franken .............. G03F 7/70825 355/53 |
| 2011/0170078 A1 | 7/2011 | Loopstra et al. |
| 2013/0197914 A1* | 8/2013 | Yelvington ............. G10L 15/22 704/275 |
| 2015/0062596 A1 | 3/2015 | Kwan et al. |

FOREIGN PATENT DOCUMENTS

| | | |
|---|---|---|
| WO | WO 2013/004403 A1 | 1/2013 |
| WO | 2016139012 A1 | 9/2016 |

OTHER PUBLICATIONS

International Preliminary Report on Patentability directed to related International Patent Application No. PCT/EP2018/050640, dated Aug. 13, 2019; 11 pages.

Japanese Search Report by Registered Search Organization directed to related Japanese Patent Application No. 2019-536585, dated Aug. 21, 2020; 44 pages.

* cited by examiner

LITHOGRAPHIC APPARATUS AND DEVICE MANUFACTURING METHOD

CROSS-REFERENCE TO RELATED APPLICATIONS

This application is a 35 U.S.C. 371 National Phase of PCT Application No. PCT/EP2018/050640, filed on Jan. 11, 2018, which claims priority of EP application 1715563.4 which was filed on Feb. 10, 2017, both of which are hereby incorporated by reference herein in their entirety.

FIELD OF THE INVENTION

The present invention relates to a lithographic apparatus and a method for manufacturing a device.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. Typically, such a patterned radiation beam undergoes various transformations (e.g. a demagnification) between the patterning device and the target portion on the substrate. Such transformations are typically realized by means of a projection system which may include various optical elements such as mirrors and/or lenses. In case, during the transfer of the pattern to the target portion, a relative position of such optical elements would change, this could cause a deformation or a displacement of the patterned radiation beam as received by the substrate. Such a deformation or displacement may cause an overlay error. In order to avoid or mitigate this effect, it has been suggested to monitor a position of such optical elements by means of a position measurement system that measures the position of the optical elements relative to a frame, e.g. an isolated frame, also referred to as a sensor frame. By monitoring the position of the optical elements relative to this sensor frame, the effect of a relative displacement of said optical elements may be determined and taken into account, e.g. by adjusting a position of the substrate relative to the projection system.

It has however been observed that such an isolated sensor frame, which may serve as a reference position for the optical elements, may also be subject to deformations, e.g. due to forces that are exerted on it. As such, there is a need for an improved sensor frame for monitoring the (relative) positions of optical elements in a projection system of a lithographical apparatus.

SUMMARY OF THE INVENTION

It is desirable to provide a lithographic apparatus whereby a position of optical elements of a projection system may be monitored more accurately.

According to a first aspect of the invention, there is provided a lithographic apparatus comprising:
a projection system configured to project a patterned beam of radiation onto a substrate; the projection system comprising a plurality of optical elements;
a sensor frame;
a first position measurement system configured to measure a position of the plurality of optical elements relative to the sensor frame; wherein the sensor frame comprises:
N sub-frames, N being an integer >1,
a coupling system coupling the N sub-frames and
a second position measurement system configured to determine a relative position of the N sub-frames.

According to a second aspect of the invention, there is provided a lithographic apparatus comprising:
a projection system configured to project a patterned beam of radiation onto a substrate; the projection system comprising a plurality of optical elements;
a sensor frame;
at least one actuator configured to exert a vertically oriented force on the sensor frame; a first position measurement system configured to measure a position of the plurality of optical elements relative to the sensor frame, wherein the sensor frame is supported by M vibration isolators, M being an integer 1≤M<3, the M vibration isolators and the vertically oriented force supporting the sensor frame at distinct, non-collinear, locations.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
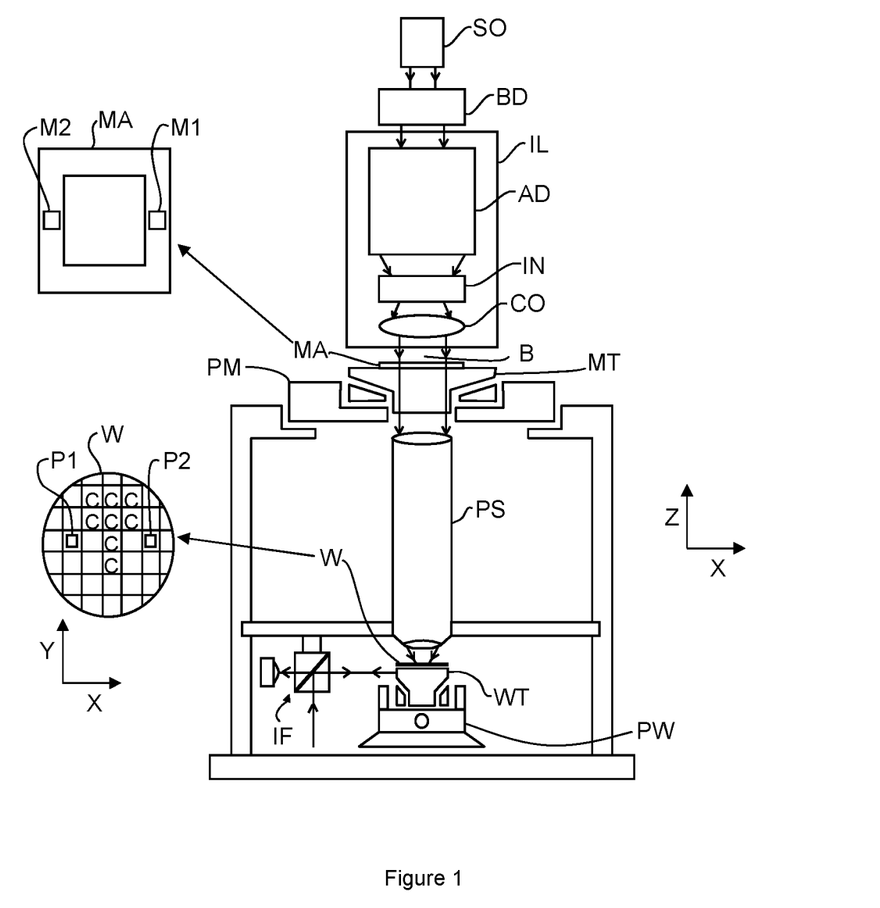
FIG. 1 depicts a lithographic apparatus according to a first embodiment of the invention.

FIG. 1 schematically depicts a lithographic apparatus according to one embodiment of the invention. The lithographic apparatus comprises an illumination system IL, a support structure MT, a substrate table WT and a projection system PS. The illumination system IL is configured to condition a radiation beam B. The support structure MT is constructed to support a patterning device MA and is connected to a first positioning device PM configured to accurately position the patterning device MA in accordance with certain parameters. The substrate table WT is constructed to hold a substrate W, e.g., a resist-coated wafer, and is connected to a second positioner PW configured to accurately position the substrate W in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The illumination system IL receives the radiation beam B from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam B, to have a desired uniformity and intensity distribution in its cross-section.

The term "radiation beam" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. An additional table may be arranged to hold at least one sensor, instead of holding a substrate W. The at least one sensor may be a sensor to measure a property of the projection system PS, a sensor to detect a position of a marker on the patterning device MA relative to the sensor or may be any other type of sensor. The additional table may comprise a cleaning device, for example for cleaning part of the projection system PS or any other part of the lithographic apparatus.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The radiation beam B is incident on the patterning device MA, which is held on the support structure MT, and is patterned by the patterning device MA. Having traversed the support structure MT, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module provides movement of the support structure MT over a large range with limited accuracy (coarse positioning), whereas the short-stroke module provides movement of the support structure MT relative to the long-stroke module over a small range with high accuracy (fine positioning). Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Substrate alignment marks P1, P2 are known as scribe-lane alignment marks, when they are located in spaces between the target portions C. Similarly, in situations in which more than one die is provided on the patterning device MA, the mask alignment marks M1, M2 may be located between the dies.

The depicted apparatus could be used in at least one of the following modes:

In a first mode, the step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In a third mode, the support structure MT is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device MA is updated as required after each movement of the substrate table WT or in between successive radiation pulses during a scan. This mode of operation can be readily applied to maskless lithography that utilizes programmable patterning device, such as a programmable mirror array of a type as referred to above.

The lithographic apparatus further includes a control unit which controls the actuators and sensors described. The control unit also includes signal processing and data processing capacity to implement desired calculations relevant to the operation of the lithographic apparatus. In practice, the control unit will be realized as a system of many sub-units. Each sub-unit may handle the real-time data acquisition, processing and/or control of component within the lithographic apparatus. For example, one sub-unit may be dedicated to servo control of the second positioner PW. Separate sub-units may handle the short-stroke module and the long-stroke module, or different axes. Another sub-unit may be dedicated to the readout of the position sensor IF. Overall control of the lithographic apparatus may be controlled by a central processing unit, communicating with the sub-units, with operators and with other apparatuses involved in the lithographic manufacturing process.

Combinations and/or variations on the above described modes of use or entirely different modes of use may also be employed.

In accordance with the present invention, the patterned radiation beam traverses the projection system PS, thereby undergoing various transformations (e.g. a demagnification) between the patterning device MA and the target portion C on the substrate W. Such transformations are typically realized by means of a projection system PS which may include various optical elements such as mirrors and/or lenses. In case, during the transfer of the pattern to the target portion, a relative position of such optical elements would change, this could cause a deformation or a displacement of the patterned radiation beam as received by the substrate. Such a deformation or displacement may cause an overlay error. In order to avoid or mitigate such error, the lithographic apparatus according to the present invention further comprises a sensor frame and a position measurement system for measuring a position of the optical elements relative to the sensor frame. Note that in such an arrangement, the sensor frame may thus be used as a reference position for the optical elements. By monitoring the position of the optical elements, a discrepancy between an actual position and a desired position may be detected and in response, appropriate action may be taken. As an example, in case the discrepancy is known to cause a displacement of the patterned radiation beam, this displacement can be taken into account by the positioner PW controlling a position of the substrate W. Alternatively, or in addition, the position of the optical elements may be controlled (e.g. by exerting forces on the optical elements), in order to reduce the positional error of the optical element or elements. The inventors of the present invention have observed that the above described approach may still have its drawbacks. In particular, it has been observed that it may be difficult to maintain the entire sensor frame into a reference position. It has been observed that the sensor frame as applied in known apparatuses may deform, due to forces that are transmitted to it. Note that such a sensor frame may typically be mounted to a base or a separate frame by means of vibration isolators. Such isolators may however still allow some vibrations to be transmitted, causing the sensor frame to deform. One way to mitigate this effect would be to apply a plurality of separate sensor frames, each provided with a position measurement system to monitor the position of the various optical elements of the projection system. Such an arrangement might however require a comparatively large number of vibration isolators.

As an alternative, in accordance with a first aspect of the present invention, an arrangement is proposed to subdivide the sensor frame into N sub-frames, N being an integer >1, whereby the sub-frames are coupled together by means of a coupling system. In addition, the relative position of the N sub-frames is monitored by means of a position measurement system.

Figure 2:
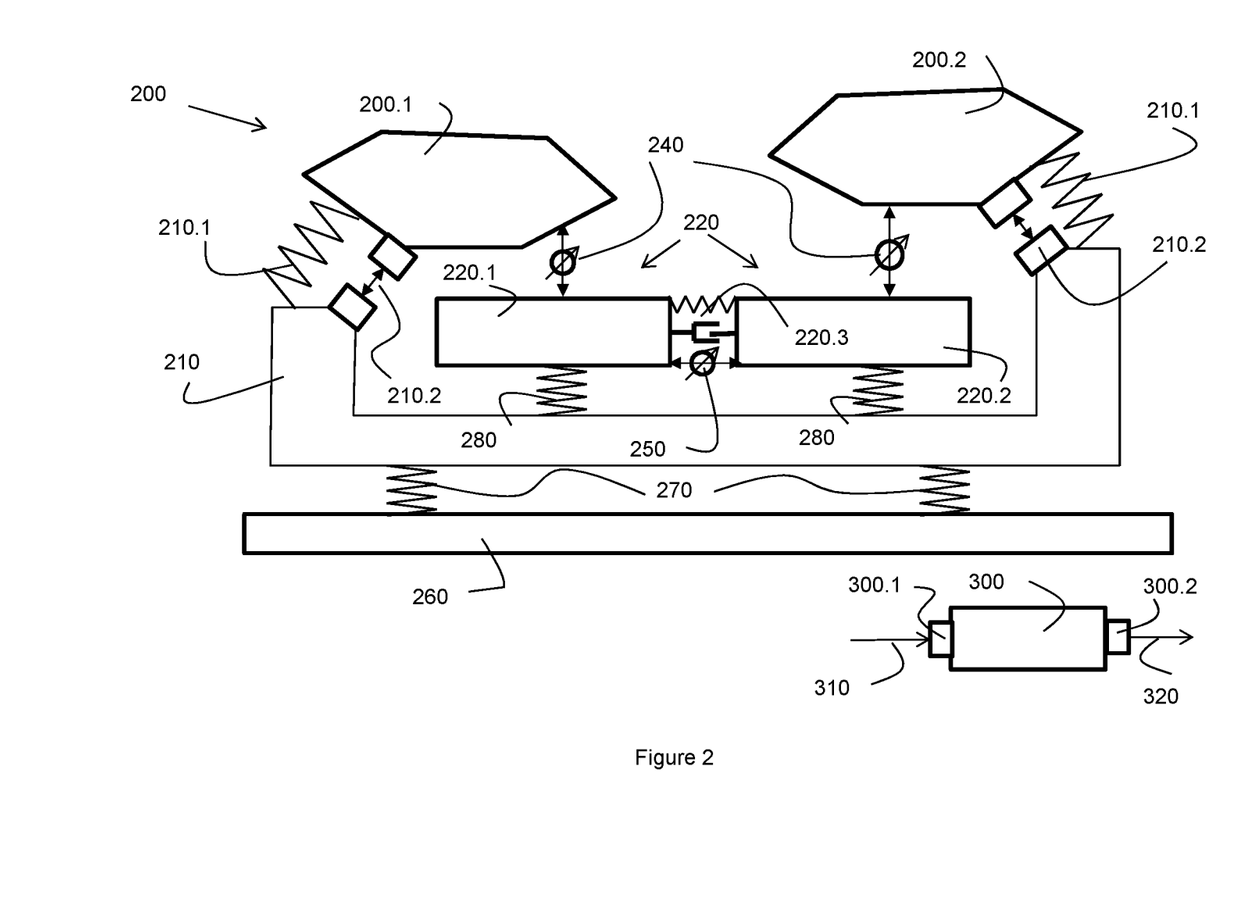
FIG. 2 depicts part of a lithographic apparatus according to a second embodiment of the invention.

FIG. 2 schematically depicts part of a lithographic apparatus according to the first aspect of the present invention. FIG. 2 schematically shows a projection system 200 including two optical elements 200.1 and 200.2. FIG. 2 further shows a force frame 210 configured to support the optical elements 200.1, 200.2. Such a support may e.g. be realized using one or more vibration isolators 210.1 or actuators 210.2. in the embodiment as shown, the lithographic apparatus further comprises a sensor frame 220 comprising a first sub-frame 220.1 and a second sub-frame 220.2 that is coupled to the first sub-frame 220.1 by means of a coupling system 220.3, schematically indicated as a damper-spring combination. In the embodiment as shown, the lithographic apparatus further comprises a first position measurement system 240 for measuring a position of the optical elements 200.1, 200.2 relative to the sensor frame 220, and a second position measurement system 250 for measuring a relative position of the sub-frames 220.1, 220.2. In the embodiment as shown, the force frame 210 is mounted to the base frame 260 of the apparatus, by means of vibration isolators 270. Further, as can be seen, the sensor frame 220 is mounted, by means of vibration isolators 280 to the force frame.

In the embodiment as shown, a displacement of the optical elements 200.1 and/or 200.2 relative to the sensor frame 220 can be monitored, by means of the position measurement system 240. Such a position measurement system may e.g. comprise an interferometer based measurement system or an encoder based measurement system. Capacitive or inductive measurement system may be considered as well.

In the embodiment as shown, the sensor frame 220 comprises two sub-frames that are coupled together by means of a coupling system 220.3. In an embodiment, the coupling system may e.g. comprises a spring and a damper. Coupling the sub-frames together provides in one or more of the following advantages, compared to a system having multiple, independent sensor frames:

By coupling the sensor sub-frames, the measurement range of the position measurement system 250, which monitors the relative position of the sub-frames, can be kept comparatively small. In general, a measurement range <1 μm, typically about 10 nm would be sufficient.

By keeping the sub-frames connected together, the support of the sensor frame 220 as a whole can be realized by substantially the same number of vibration isolators 280 that would be required to support a substantially rigid sensor frame.

By subdividing the sensor frame 220 into a plurality of sub-frames and connecting the sub-frames, an arrangement is realized whereby a deformation of the sensor frame can be more easily controlled or monitored. By subdividing the sensor frame and connecting the sub-frames, the sensor frame is allowed to deform, e.g. due to vibrational forces that are transmitted from the force frame 210, in a more controlled or predictable manner. In particular, by introducing a certain flexibility in the coupling system 220.3, the sub-frames 220.1 and 220.2 will substantially exhibit a rigid body behavior, i.e. they will be allowed to displace (e.g. translate and rotate), substantially without deforming. Phrased differently, any deformation of the sensor frame may be, due to the coupling system connecting the sub-frames, be concentrated in the coupling system 220.3. As a result, the behavior of the sensor frame as a whole may be more predictable and thus controllable. In accordance with the first aspect of the present invention, a position measurement system 250 is provided to measure a relative position of the sub-frames of the sensor frame 220. Due to the coupling of the sub-frames by means of the coupling system, the position measurement system 250 only needs to have a small operating range. Suitable position measurement systems may e.g. include encoder based measurement systems, capacitive or inductive measurement systems. In an embodiment, the position measurement system 250 is configured to measure a relative position of the sub-frames in multiple degrees of freedom, e.g. including rotational degrees of freedom. In an embodiment, the position measurement system 250 is configured to measure a relative position of the sub-frames in 6 degrees of freedom (6 DOF). When the relative position of the sub-frames is known, the position of the optical elements 200.1, 200.2 may be accurately determined based on measurements of the position measurement system 240 which measures the position of the optical elements relative to the sub-frames. In case these positions or relative positions would deviate from a desired position, an appropriate control action can be taken. Such control action could e.g. include a controlled displacement of either one or more of the optical elements and/or the one or both of the stages, i.e. the support MT or the substrate table WT.

As such, in an embodiment of the present invention, the lithographic apparatus therefore comprises a control unit 300 configured to control an operating parameter or state of the apparatus. Such a control unit 300 may e.g. be embodied as a controller, microprocessor, computer or the like. In the embodiment as shown, the control unit 300 comprises an input terminal 300.1 for receiving input signals 310. In an embodiment, the input terminal 300.1 may e.g. be configured to receive the position measurement signals of the position measurement systems 240 and 250, whereby the control unit 300 may be configured to determine, based on the measurement signals as received, a position of the optical elements 200.1, 200.2 of the projection system 200. Based on this positional information, the control unit may e.g. generate a control signal and output this control signal 320 via an output terminal 300.2 of the control unit 300. Such a control signal 320 may e.g. be a control signal for controlling an operation of the actuators 210.2, thereby controlling a position of the optical elements 200.1, 200.2. Alternatively, or in addition, the control unit 300 as applied in the embodiment of the present invention may be configured to determine a control signal for controlling a positioning of a substrate in the lithographic apparatus, in particular a positioning of the substrate relative to a patterned radiation beam that is projected onto the substrate via the projection system 200. By doing so, a displacement of the patterned radiation beam due to a displacement of the one or more of the optical elements of the projection system 200 may be corrected for.

In an embodiment, the coupling system 220.3 comprises a mechanical spring and a passive damper.

In accordance with the present invention, the coupling system between the sub-frames should preferably by sufficiently stiff to allow the sensor frame to be supported by a limited number of supports, e.g. 3 or 4. At the same time, the coupling between the sub-frames should be at a frequency below the lowest eigen frequencies of the sub-frames. Typically, the first eigen frequency of a single-body sensor frame may e.g. be 200 Hz or more. By sub-dividing the frame as described above, e.g. in two sub-frames, the first eigenfrequency of the two sub-frames would be 250 Hz or more. On the other hand, the suspension of the combined frame, by means of the vibration isolators, would be, for example, designed to be between 3 and 15 Hz. Taking these values into account, the eigenfrequency of the coupling system between the two sub-frames may typically be designed to be in a range between 20 and 250 Hz, e.g. between 50 and 150 Hz. To avoid an undamped resonant behavior at this frequency, a damping of at least a few percent may be preferred, typically around 5%.

In an embodiment of the present invention, the coupling system as applied to connect the sub-frames of the sensor frame include an active damping system. Such an active damping system may e.g. include a displacement sensor configured to determine a relative displacement of the sub-frames that are connected by the coupling system and an actuator to exert a force on the sub-frames to counteract the displacement. In an embodiment, both the displacement sensor and the actuator are implemented by means of piezo-electric components. Alternatively, active damping system only include an actuator which receives a control signal from the control unit 300, whereby the control unit is configured to determine the control signal based on the position measurement made by the position measurement system 250.

In the embodiment as shown, the sensor frame 220 is supported, by means of vibration isolators 280, by the force frame 210. It can be pointed out that alternative arrangements may be considered as well.

Figure 3A:
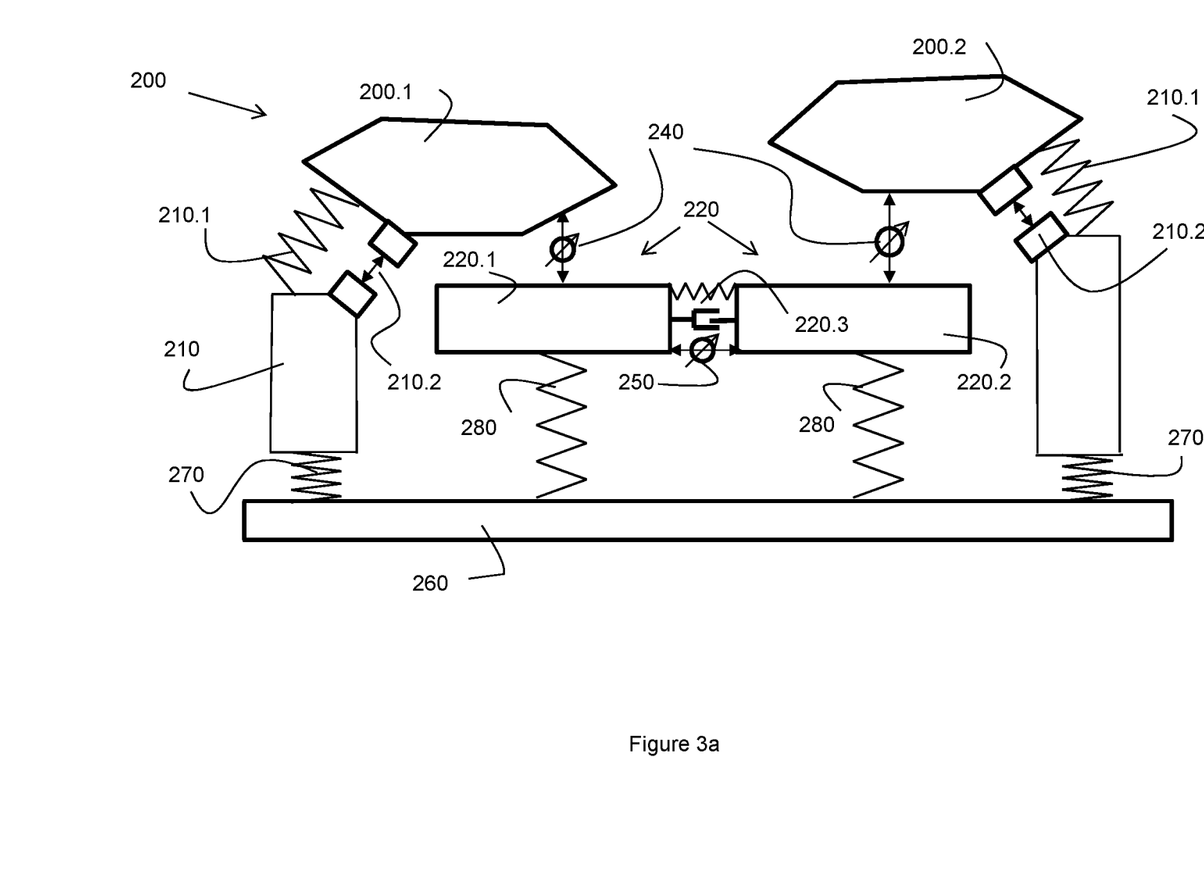
FIGS. 3a and 3b depict part of a lithographic apparatus according to a third and fourth embodiment of the invention.
Figure 3B:
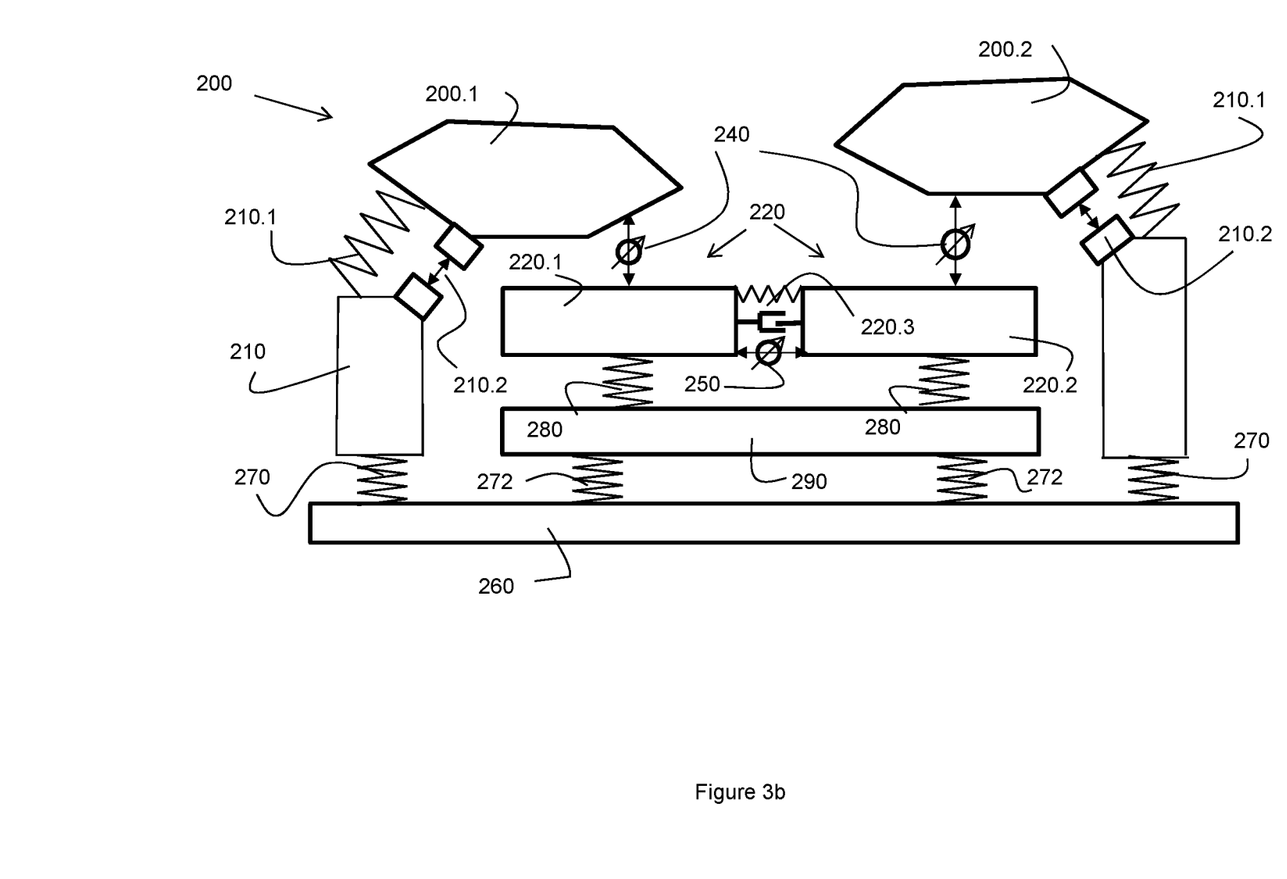

Two of such alternative arrangements are schematically shown in FIGS. 3a and 3b. As a first alternative, shown in FIG. 3a, the sensor frame 220 may be mounted to the base frame 260, in a similar manner as the force frame 210 is mounted to the base frame 260.

As a second alternative, as shown in FIG. 3b, the sensor frame 220 is mounted, by means of vibration isolators 280, to a separate frame 290, separate from the force frame, whereby the separate frame, which may also be referred to as an intermediate frame 290, is mounted, by means of vibration isolators 272, which may e.g. similar to the vibration isolators 270 supporting the force frame. By means of the intermediate frame 290 and the vibration isolators 272 and 280, the sensor frame 220 shown in FIG. 3b may be isolated in a similar manner as shown in FIG. 2. An additional advantage of the arrangement of FIG. 3b is that it provides an improved isolation between the force frame 210 and the sensor frame 220, because the sensor frame 220 is no longer directly supported by the force frame 210. This results in less disturbances of the sensor frame 220. Regarding the embodiment as shown, it may further be pointed out that the intermediate frame 290 may additionally be applied for the mounting of a position measurement system for a positioning device such as the positioner PW as shown in FIG. 1. As an example, an interferometric measurement system may be mounted to the intermediate frame 290, the interferometric measurement system e.g. being configured to emit a laser beam towards a substrate table, e.g. substrate table WT as shown in FIG. 1, that is positioned by the positioner PW. Alternatively, in case of an encoder based measurement system, one or two-dimensional encoder gratings may be mounted to the intermediate frame 290, the gratings being configured to co-operate with optical encoder sensors that are mounted on the substrate table WT that is positioned by the positioner PW.

In the embodiments as shown in FIGS. 2, 3a and 3b, the sensor frame 220 is subdivided into N sub-frames, thus enabling to obtain a better control of deformations of the sensor frame 220 that are caused by vibrations exerted on the frame.

It has been observed by the inventors that there may be other causes of deformation of the sensor frame. In the embodiments as shown, the sensor frame 220 is mounted to either a force frame 210 (FIG. 2), a base frame (FIG. 3a) or an intermediate frame (FIG. 3b), by means of vibration isolators. Such vibration isolators may e.g. be mechanical systems including mechanical springs. Such a spring-based system may be designed to have a particular stiffness in the translational directions (X, Y, Z), selected to obtain a desired suspension frequency of the sensor frame. Ideally, one would like such a vibration isolator to have a zero stiffness for the rotational directions and to have no cross-talk between the directions of movement. However, in practice, such cross-talk and a non-zero stiffness for the rotational directions may be difficult, if not impossible, to realize. Within the meaning of the present invention, this cross-talk and non-zero stiffness is referred to as parasitic stiffness. It would be desirable to minimize this parasitic stiffness because it may cause an additional deformation of the sensor frame. As will be understood by the skilled person, in case of a deformation or movement of the supporting frame (either the force frame, the base frame or the intermediate frame), such a deformation would also result in a deformation of the sensor frame, due to the parasitic stiffness. This effect may in particular occur in case the sensor frame is supported in an overdetermined manner, e.g. by more that three vibration isolators or by vibration isolators having a parasitic stiffness. With respect to the occurrence of a parasitic stiffness, it may e.g. be pointed out that such a parasitic stiffness may also be referred to by means of a stiffness matrix having non-zero elements in non-diagonal locations.

Figure 4:
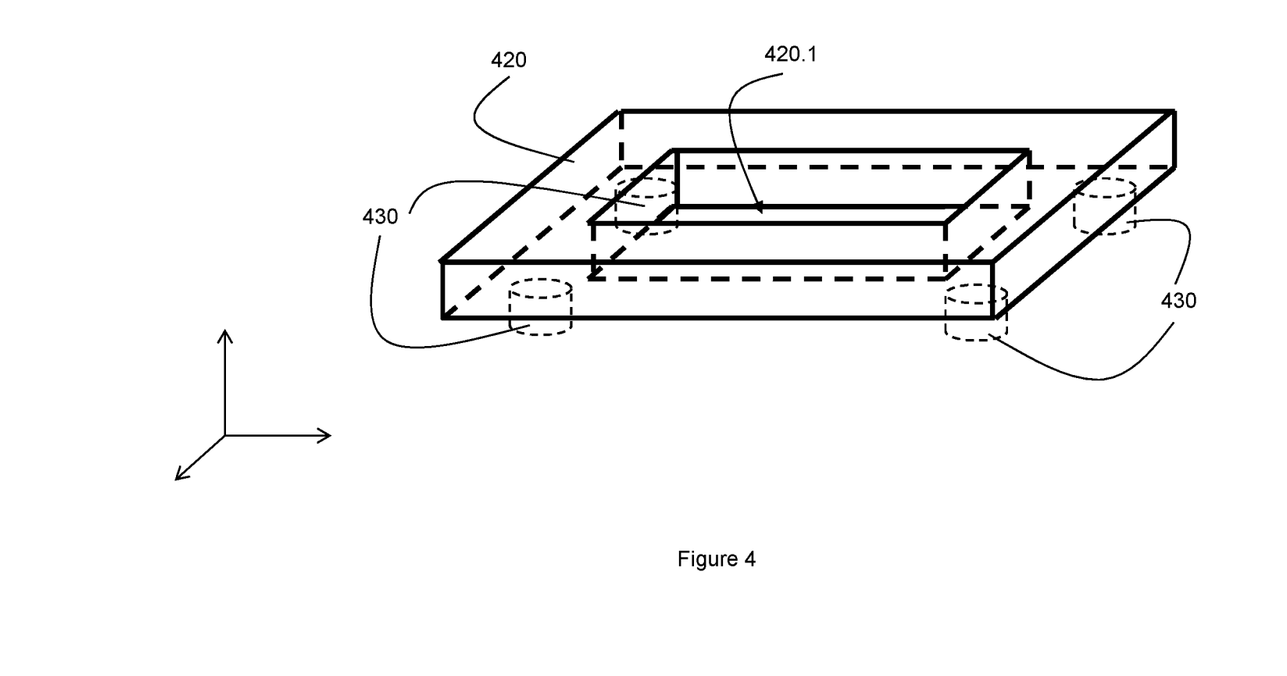
FIG. 4 depicts a sensor frame and support of a lithographic apparatus.

With respect to the mounting or supporting of the sensor frame, it may be pointed out that an overdetermined support may be required due to physical constraints imposed by the layout of the lithographic apparatus. As an example, in case of an EUV-based lithographic apparatus, the projection system may comprise a plurality of mirrors, who's position needs to be monitored. The particular layout, e.g. size and orientation, of the mirrors is dictated by the optical design of the projection system. The sensor frame that is used to monitor the optical elements has to be designed in such a manner that it does not interfere with the optical design, including the trajectory of the patterned radiation beam. FIG. 4 schematically shows a sensor frame 420 that may be applied in an EUV based lithographic apparatus. The sensor frame 420 as shown has a substantially rectangular shape and has an aperture 420.1, through which the patterned radiation beam can pass. In the embodiment as shown, the sensor frame 420 is supported by 4 vibration isolation systems or vibration isolators 430. The vibration isolators 430 may e.g. be mechanical isolators configured to support the sensor frame with a suspension frequency in a range from 3 Hz to 15 Hz, preferably about 6 Hz. Due to the parasitic stiffness as described above, such a sensor frame arrangement may thus suffer from induced deformations, rendering the application of the sensor frame as a position reference for the optical elements somewhat flawed. In addition to the effects of parasitic stiffness, deformation forces may also be transported to the sensor frame when it is mounted in an overdetermined manner, and the supporting frame itself deforms. For example, when the sensor frame is supported by 4 isolators, a torsion shape of the supporting frame will also lead to forces on the sensor frame even when no parasitic stiffness is present in the isolators.

In accordance with the second aspect of the present invention, a deformation of the sensor frame due to parasitic stiffness of the vibration isolators, e.g. vibration isolators 430 may be avoided or mitigated by reducing the number of vibration isolators having such parasitic stiffness and introducing at least one controlled actuator force onto the sensor frame, whereby the controlled actuator force and the vibration isolators are arranged in distinct, non-collinear locations.

Figure 5:
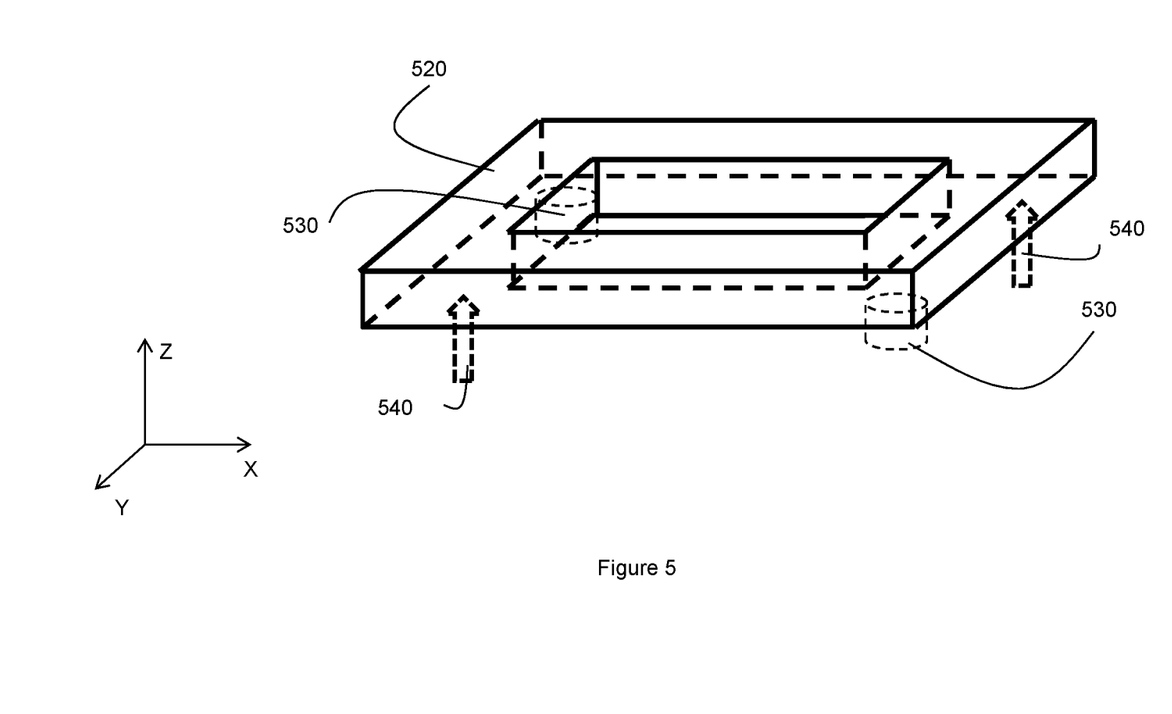
FIG. 5 depicts a sensor frame and support that can be applied in a lithographic apparatus according to the present invention.

FIG. 5 schematically depicts a first embodiment of a suspended sensor frame as can be applied in a lithographic apparatus according to the second aspect of present invention. FIG. 5 schematically shows a sensor frame 520 that is supported by means of two vibration isolators 530 and is controlled by means of two actuator forces 540 exerted on it.

In an embodiment, the actuator forces as applied to the sensor frame are substantially unidirectional forces, e.g. oriented in the vertical direction (Z-direction).

In an embodiment, the actuators as applied to generate the actuator forces are permanent magnet actuators. Such actuators may be constructed to generate a unidirectional force while having a low stiffness, both in the actuating direction and directions perpendicular to it. In such an arrangement, the actuator may e.g. comprise a coil assembly configured to co-operate with a permanent magnet assembly to generate the required force. With reference to FIG. 2, the coil assembly of such an actuator arrangement could e.g. be mounted to the force frame 210, whereas the permanent magnet assembly could be mounted to the sensor frame 220.

Such electromagnetic actuators, e.g. permanent magnet actuators, are typically construed as contactless actuators, i.e. the coil assembly and the permanent magnet assembly are separated by a gap, e.g. an air gap. Such actuators are typically highly suited for generating an unidirectional force, substantially without any cross-talk or parasitic stiffness. More specifically, a permanent magnet actuator may be designed to generate an desired force in a 3D operating range, whereby the generated force remains substantially the same, irrespective of the relative position of the coil assembly and the permanent magnet assembly within the operating range.

In an embodiment, the actuators that generate the actuator forces are configured to stabilize the sensor frame. In an embodiment, the actuators may be configured to exert forces onto the sensor frame such that the sensor frame is suspended at a desired frequency. By applying one or more controlled actuator forces, the number of vibration isolators can be reduced, resulting in a reduced effect of the parasitic stiffness of the vibration isolators.

This may e.g. be realized by measuring the relative displacement of the sub-frames and provide this relative displacement as feedback to a controller of the actuator or actuators, whereby the control may control the actuator or actuators to exert a force on the sub-frame to counteract the relative displacement. By doing so, an 'electronic' stiffness of a desired magnitude may be realized.

Figure 6:
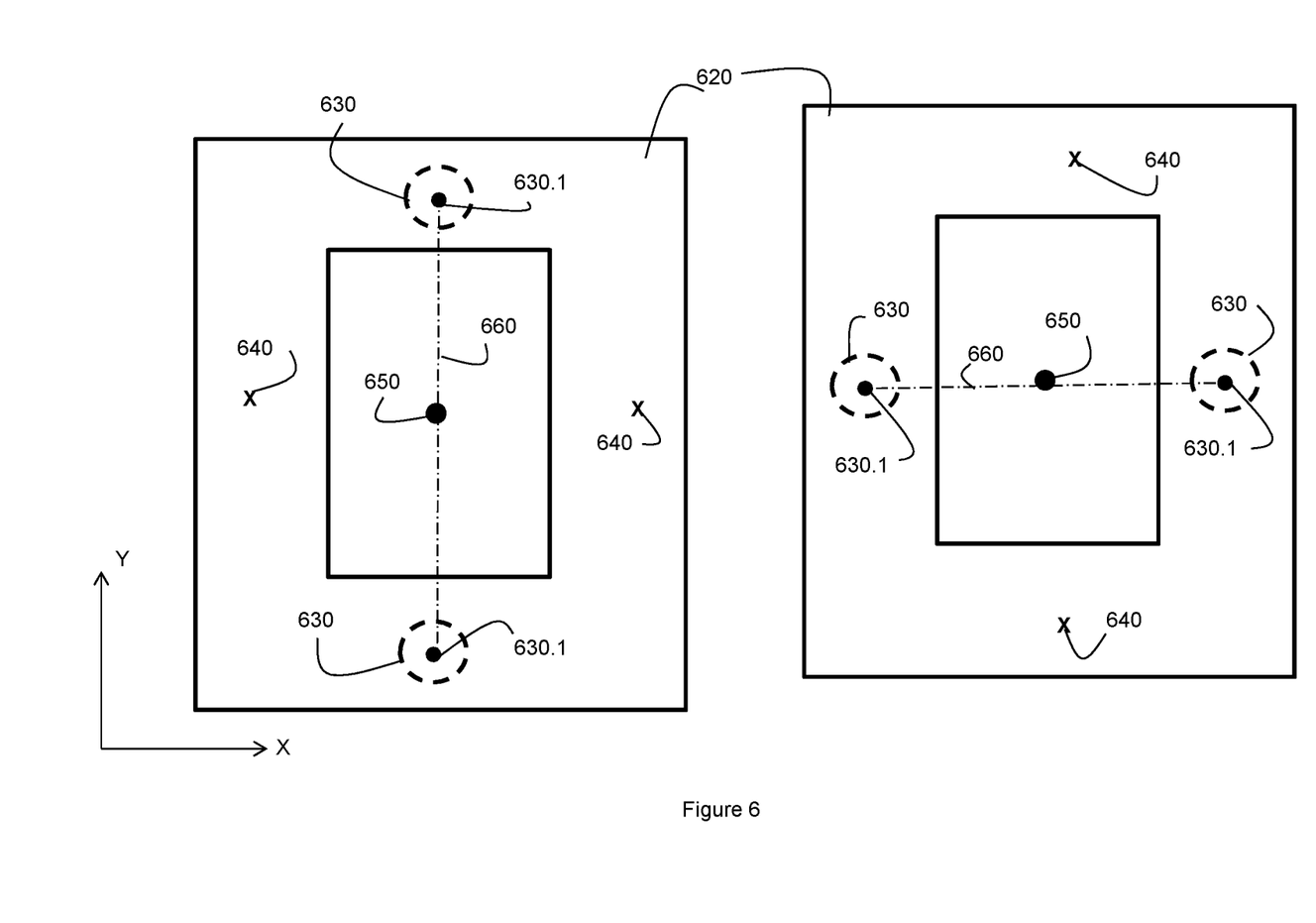
FIG. 6 depicts two embodiments of a sensor frame and support that can be applied in a lithographic apparatus according to the present invention.

In an embodiment, the sensor frame is supported by only two vibration isolators and controlled by one or more actuator forces. In such embodiment, the two vibration isolators may be arranged to support the sensor frame in a substantially balanced manner. By doing so, the required control forces exerted on the sensor frame by the actuators can be minimized. Such condition can be realised by positioning the vibration isolators in such manner that a projection on a horizontal plane of the centre of gravity of the sensor frame is on a projection on the horizontal plane of a line connecting the vibration isolators support positions. FIG. 6 schematically depicts two possible arrangements of the locations of the vibration isolators and actuators to support and control a sensor frame, in accordance with the present invention. In the embodiment on the left, the sensor frame 620 is supported by two vibration isolators 630 arranged along a longitudinal axis of the frame. A position of the frame 620 is further controlled by two actuator forces exerted on the frame at the positions 640 that are marked with an 'X'. in the embodiment on the right, the vibration isolators are on an axis perpendicular to the longitudinal axis. Note that in both embodiments, the vibration isolators 630 are positioned in such manner that a projection on a horizontal plane (i.e. the XY-plane) of the centre of gravity 650 of the sensor frame 620 is on a projection on the horizontal plane of a line 660 connecting the vibration isolators support positions 630.1.

In an embodiment, the first and second aspect of the present invention may be combined. In such an arrangement, the sensor frame may be subdivided into N sub-frames, N being an integer >1 and being supported by M vibration isolators, M being an integer 1≤M<3, and at least one vertically oriented actuator force.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate W referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate W may be processed more than once, for example in order to create a multi-layer IC, so that the term substrate W used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device MA defines the pattern created on a substrate. The topography of the patterning device may be pressed into a layer of resist supplied to the substrate whereupon the resist is cured by applying electromagnetic radiation, heat, pressure or a combination thereof. The patterning device MA is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a projection system configured to project a patterned beam of radiation onto a substrate;
the projection system comprising a plurality of optical elements;
a sensor frame comprising N sub-frames, N being an integer greater than one, and a coupling system coupling the N sub-frames;
a first position measurement system configured to measure a position of a given one of the plurality of optical elements relative to a given one of the N sub-frames;
a second position measurement system configured to determine a relative position of the N sub-frames with respect to each other;
a base frame; and
a force frame,
wherein the force frame is coupled to the plurality of optical elements by a first plurality of vibration isolators, and
wherein the force frame is supported on the base frame by a second plurality of vibration isolators.

2. The lithographic apparatus according to claim 1, wherein the sensor frame is supported by the force frame by means of plurality of sensor frame/force frame vibration isolators.

3. The lithographic apparatus according to claim 1, wherein the sensor frame is supported by the base frame by means of a plurality of sensor frame/base frame vibration isolators.

4. The lithographic apparatus according to claim 1, wherein the coupling system comprises a spring-damper system.

5. The lithographic apparatus according to claim 4, wherein the spring-damper system comprises an active damper.

6. The lithographic apparatus according to claim 1, wherein the second position measurement system comprises an encoder based measurement system.

7. The lithographic apparatus according to claim 1, further comprising:
a substrate table configured to hold the substrate;
a positioning device configured to position the substrate table, and
a control unit, the control unit being configured to:
receive a first position measurement signal of the first position measurement system;
receive a second position measurement signal of the second position measurement system;
determine a determined position of the plurality of optical elements based on the first position measurement signal and the second position measurement signal; and
generate a control signal for the positioning device, based on the determined position.

8. The lithographic apparatus according to claim 1, further comprising:
an actuator assembly configured to position at least one optical element of the plurality of optical elements;
a control unit, the control unit being configured to:
receive a first position measurement signal of the first position measurement system;
receive a second position measurement signal of the second position measurement system;
determine a determined position of the plurality of optical elements based on the first position measurement signal and the second position measurement signat and generate a control signal for the positioning device, based on the determined position.

9. The lithographic apparatus according to claim 1, further comprising at least one actuator configured to exert a substantially vertically oriented force on the sensor frame, and wherein the sensor frame is supported by M vibration isolators, M being an integer $1 \leq M < 3$, the M vibration isolators and the substantially vertically oriented force supporting the sensor frame at distinct non-collinear locations.

10. The lithographic apparatus according to claim 1, wherein the coupling system comprises a spring-damper system.

11. The lithographic apparatus according to claim 2, wherein the coupling system comprises a spring-damper system.

12. The lithographic apparatus according to claim 3, wherein the coupling system comprises a spring-damper system.

13. The lithographic apparatus according to claim 1, wherein the second position measurement system comprises an encoder based measurement system.

14. The lithographic apparatus according to claim 2, wherein the second position measurement system comprises an encoder based measurement system.

15. The lithographic apparatus according to claim 3, wherein the second position measurement system comprises an encoder based measurement system.

16. The lithographic apparatus according to claim 4, wherein the second position measurement system comprises an encoder based measurement system.

* * * * *